(12) United States Patent
Tarui et al.

(10) Patent No.: US 6,608,339 B2
(45) Date of Patent: Aug. 19, 2003

(54) FERROELECTRIC MEMORY ELEMENT

(75) Inventors: Yasuo Tarui, Tokyo (JP); Kazuo Sakamaki, Tokyo (JP)

(73) Assignees: Yasuo Tarui, Tokyo (JP); Nippon Precision Circuits Inc., Tokyo (JP)

( * ) Notice: Subject to any disclaimer, the term of this patent is extended or adjusted under 35 U.S.C. 154(b) by 0 days.

(21) Appl. No.: 09/824,401

(22) Filed: Apr. 2, 2001

(65) Prior Publication Data

US 2001/0028582 A1 Oct. 11, 2001

(30) Foreign Application Priority Data

Apr. 7, 2000 (JP) ........................................ 2000-105893

(51) Int. Cl.[7] ................................................ H01L 29/76

(52) U.S. Cl. ........................ 257/295; 257/296; 257/300; 365/145

(58) Field of Search ................................ 257/295, 300, 257/296; 365/145

(56) References Cited

U.S. PATENT DOCUMENTS

| 4,437,139 | A | * | 3/1984 | Howard | 204/192.15 |
|---|---|---|---|---|---|
| 5,248,564 | A | * | 9/1993 | Ramesh | 257/295 |
| 5,307,305 | A | * | 4/1994 | Takasu | 365/145 |
| 5,326,721 | A | * | 7/1994 | Summerfelt | 117/105 |
| 5,572,052 | A | * | 11/1996 | Kashihara et al. | 257/295 |
| 5,913,117 | A | * | 6/1999 | Lee | 438/240 |
| 6,057,584 | A | * | 5/2000 | Gardner et al. | 257/295 |
| 6,084,260 | A | * | 7/2000 | Hirai et al. | 257/295 |
| 6,087,688 | A | * | 7/2000 | Furuta et al. | 257/295 |

* cited by examiner

Primary Examiner—George Eckert
(74) Attorney, Agent, or Firm—Jordan and Hamburg LLP

(57) ABSTRACT

Ferroelectric memory element having an MFIS structure including a silicon semiconductor substrate and an insulating film arranged above the silicon semiconductor substrate. The insulating film includes a low dielectric constant layer restraining film and a mutual diffusion preventive film so that an unnecessary, low dielectric constant layer is prevented from forming between the semiconductor substrate and the insulating film. A ferroelectric film is arranged on the insulating film. The low dielectric constant layer restraining film is thinner than the ferroelectric film.

9 Claims, 4 Drawing Sheets

FIG. 5
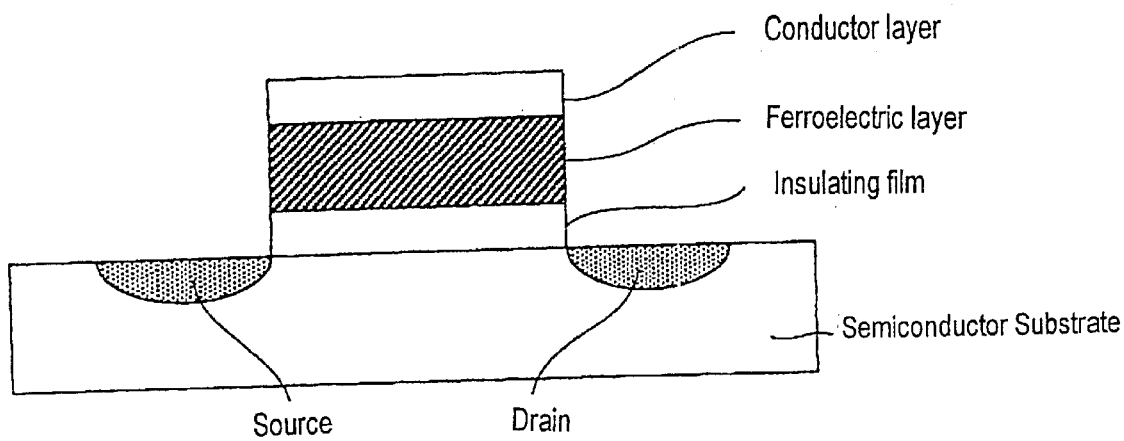
Prior Art
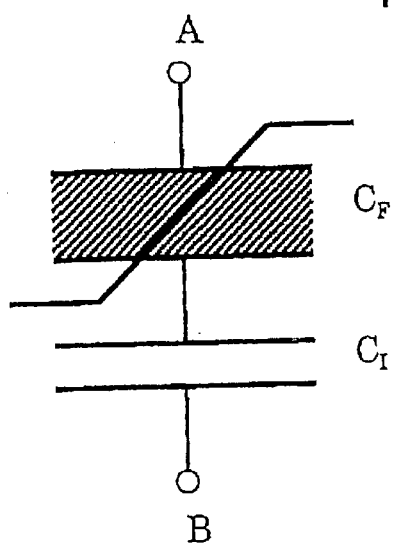
FIG. 6

FERROELECTRIC MEMORY ELEMENT

BACKGROUND OF THE INVENTION

1. Field of the Invention

The present invention generally relates to a ferroelectric memory element, and more particularly, to a non-volatile memory capable of controlling current between a source and a drain of a transistor by using a ferroelectric thin film at a gate thereof and a non-volatile memory using electric charge of a ferroelectric capacitor.

2. Description of the Related Art

Conventionally, a ferroelectric non-volatile memory FRAM (Ferroelectric Random Access Memory) which has been reduced into practice, is operated at low voltage. Further, the ferromagnetic non-volatile memory FRAM is regarded to be more excellent than conventional EEPROM (Electrically Erasable and Programmable Read Only Memory), Flash Memory or the like in view of its superior rewriting ability. However, a FRAM is provided with a structure in which a capacitor of DRAM is replaced by a ferroelectric capacitor (described in Japanese Patent Laid-Open No. 1113496/1990) and needs to rewrite at each reading of data. Either of the reading and writing operation is accompanied by polarization inversion of a ferroelectric material such that fatigue of the ferromagnetic material is significant. Further, either of the operations is accompanied by charging and discharging of the capacitor and therefore, an operational time period thereof requires about 100 nsec. Further, it is necessary to separately provide a transistor and a capacitor, which is disadvantageous in attempts to reduce the area of the device in order to provide for large capacity storage devices.

In contrast thereto, in the case of MFS-FET (Metal Ferroelectric Semiconductor Field Effect Transistor) using a ferroelectric material at a gate insulating film portion of a transistor, an interval between a source and a drain of a transistor is made ON and OFF by inducing electric charge of a channel of the transistor by polarizing the ferroelectric material and even when a cell area is proportionally reduced, a rate of changing drain current remains unchanged. This signifies that a memory cell of a ferroelectric transistor follows a scaling rule (Proceeding of Electronic, Information and Communication Society 77–9, p. 976, 1994) and there is not present a limit in view of a miniaturization principle. Further, a transistor type ferroelectric memory maintains ON and OFF of FET by polarizing a ferroelectric material and accordingly, information is not destroyed by reading operation at low voltage. A "non-destructive" reading operation can be carried out.

However, in the case of the structure, when there is constructed an MFS structure formed with a ferroelectric material directly above a silicon semiconductor substrate and formed with an upper electrode thereabove, carriers on the side of the silicon semiconductor substrate are implanted into the ferroelectric material (S. Y. Wu, IEEE Trans. Electron Devices: Vol. ED-21, No. 8, pp. 499–504 (1974)), mutual diffusion is caused between the silicon semiconductor substrate and the ferroelectric material (Jpn. J. Appl. Phys., Vol. 33, pp 5172 (1994)) and accordingly, there is not achieved an FET (Field Effect Transistor) characteristic operating adequately.

Hence, there have been proposed an MFIS-FET (Metal Ferroelectric Insulator Semiconductor FET) structure interposing a buffer layer of an insulating film between a silicon semiconductor substrate and a ferroelectric material as disclosed in Japanese Patent Laid-Open No. 64206/1997, an MFMIS-FET (Metal Ferroelectrics Metal Insulator Semiconductor-FET) interposing a metal (M) layer between a ferroelectric layer having the MFIS structure and an insulating film (T. Nakamura et al. Dig. Tech. Pap. of 1995 IEEE Int. Solid State Circuits Conf. p. 68 (1995)) and so on. The invention relates to the MFIS structure of the former.

FIG. 5 shows a section of a simplified principle view of a conventional MFIS type ferroelectric memory. In FIG. 5, a main face of a semiconductor substrate is formed with a source region and a drain region and a middle portion of the main face of the semiconductor substrate is formed with a buffer layer of an insulating film. A ferromagnetic layer and a conductor layer are laminated above the buffer layer of the insulating film.

FIG. 6 represents a portion of the MFIS structure of FIG. 5 by an equivalent circuit. FET using a ferroelectric material at a portion of a gate insulating film of a transistor utilizes polarization generated at the ferroelectric layer and accordingly, when an electric field equal to or larger than the resistance electric field is not applied to the ferroelectric layer, the polarization cannot be caused and FET does not operate as an non-volatile memory. Further, in view of a memory holding characteristic, it is necessary to apply voltage until the polarization of the ferroelectric layer is sufficiently saturated. For that purpose, when voltage is applied between an upper electrode A and the semiconductor substrate B, it is necessary to increase voltage distributed to capacitance $C_F$ (capacitance of ferroelectric layer) and for that purpose, it is important to design the insulating film such that capacitance $C_I$ (capacitance of buffer layer of insulating film) becomes larger than the capacitance $C_F$ (capacitance of ferroelectric layer). The capacitance $C_I$ and the capacitance $C_F$ are governed by a relationship in which the capacitance $C_I$ or the capacitance $C_F$ is proportional to relative dielectric constant and area of the buffer layer of the insulating film or the ferroelectric layer applied with voltage and is inversely proportional to a thickness thereof.

Although it is conceivable to make the area of the buffer layer of the insulating film larger than the area of the ferroelectric capacitance as a method of enabling the design, in the case of the MFIS structure, the area of the ferroelectric capacitance and the area of the gate insulating film of the buffer layer are determined by an area of the conductor film above the ferroelectric layer and accordingly, the area ratio cannot be changed.

Although it is conceivable to thin the buffer layer of the insulating film and to thicken the ferroelectric layer in order to design such that a capacitance $C_I$ becomes larger than the capacitance $C_F$ as other method, there is a limit in thinning the gate insulating layer in view of withstand voltage and leakage current and when the ferroelectric layer is thickened, in order to saturate the polarization of the ferroelectric material, high polarization voltage is needed and drive voltage becomes high.

A method of increasing the capacitance $C_I$ avoiding the problems mentioned above, is a method of using a material having high relative dielectric constant at the buffer layer of the insulating film. For example, the capacitance $C_I$ According to a method of forming the buffer layer of the insulating film, $CeO_2$ is directly deposited on the silicon semiconductor substrate in an oxygen atmosphere at 900° C. by electron beam vacuum vapor deposition and the coated layer is annealed in an oxygen atmosphere (700° C.) in order to lower the interface level, thereafter, annealed in an oxygen atmosphere in order to deposit and crystallize the ferroelectric thin film.

However, in this case, in forming the buffer layer and the ferroelectric thin film, by forming a low dielectric constant layer of $SiO_2$ or $CeO_x$ or the like between the silicon semiconductor substrate and the buffer layer, the film thickness is increased, the capacitance $C_1$ of the buffer layer of the insulating film is lowered and distributed voltage applied to the ferroelectric layer is reduced. As a result, there poses a problem that when the distributed voltage applied to the ferroelectric layer is low, voltage applied to the gate electrode must be increased and the MFIS type ferroelectric memory cannot be used unless drive voltage is increased.

OBJECTS AND SUMMARY OF THE INVENTION

Hence, it is an object of the invention to provide a ferroelectric memory element having high reliability and a large reading margin capable of applying sufficient distributed voltage to a ferromagnetic thin film by restraining capacitance of a buffer layer of an insulating film from lowering by restraining an interval between a silicon semiconductor substrate and a buffer layer of an insulating film from forming a low dielectric constant layer.

In order to achieve the above-described object, according to an aspect of the present invention, there is provided a ferroelectric memory element which is a ferroelectric memory element having a structure of successively laminating an insulating film and a ferroelectric film above a silicon semiconductor substrate, wherein the insulating film includes a low dielectric constant layer restraining film and a mutual diffusion preventive film.

Further, according to another aspect of the invention, the low dielectric constant layer restraining film of the ferroelectric memory element includes nitrogen in a vicinity of a surface of the silicon semiconductor substrate and the means for restraining the low dielectric constant layer is constituted by the element of nitrogen.

According to another aspect of the invention, the mutual diffusion preventive film of a ferroelectric memory element above the silicon semiconductor substrate includes nitrogen.

According to another aspect of the invention, the low dielectric constant layer restraining film provided in the insulating film is a silicon oxynitride film or a silicon nitride film. The mutual diffusion preventive film provided in the insulating film is a layer of one material or a layer laminated with two or more of materials selected from the group consisting of $CeO_2$, Ce—$ZrO_2$, YSZ (yttrium oxide stabilized zirconium oxide), $Y_2O_3$, $SrTiO_3$, $ZrO_2$, $HfO_2$ and $(BaSr)TiO_3$ (BST). The ferroelectric thin film is a thin film of one material selected from the group consisting of $PbTiO3$, $PbZr_XTi_{1-X}O_3$, $Pb_YLa_{1-Y}Zr_XTi_{1-X}O_3$, $Bi_4Ti_3O_{12}$, $Sr_2Nb_2O_7$, $Sr_2(Ta_XNb_{1-X})_2O_7$ and $SrBi_2Ta_2O_9$.

According to the above-described embodiment of the invention, the low dielectric constant layer restraining film prevents unnecessary low dielectric constant layer from being formed between the silicon semiconductor substrate and the buffer layer. Therefore, voltage sufficient for inversion of polarization of a ferroelectric material can be applied without lowering the capacitance of the insulating film. Meanwhile, the mutual diffusion preventive film prevents mutual diffusion between the silicon semiconductor substrate and the ferroelectric thin film. As a result, a ferroelectric memory element having high reliability and a large reading margin is obtained. An explanation will be given of embodiments of the invention with reference to the accompanying drawings.

BRIEF DESCRIPTION OF THE DRAWINGS

FIG. 5 is a sectional view of a conventional MFIS type ferroelectric memory element; and FIG. 6 is an equivalent circuit diagram of the MFIS type ferroelectric memory element.

DETAILED DESCRIPTION OF THE INVENTION

Figure 1:
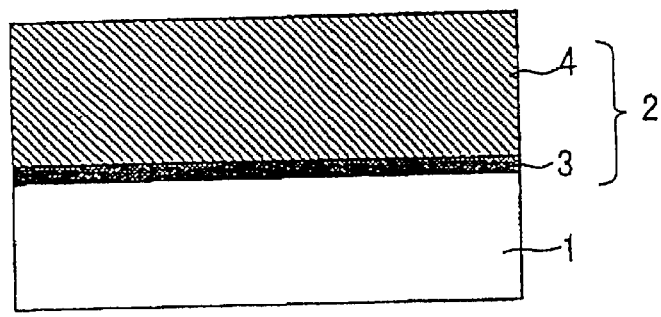
FIG. 1 is a sectional view showing a characteristic portion (CeO$_2$/SiON/Si) of an embodiment of a ferroelectric storing element according to the invention.

FIG. 1 is a sectional view showing only a characteristic portion of an embodiment of a ferroelectric memory element having an MFIS structure according to the invention. That is an insulating film 2 above a silicon semiconductor substrate 1 is provided with a low dielectric constant layer restraining film 3 and a mutual diffusion preventive film 4 is arranged above the silicon semiconductor substrate 1. The low dielectric constant restraining film 3 is a silicon oxynitride film or a silicon nitride film. The mutual diffusion preventive film 4 is a layer of one material selected from the group consisting of CeO$_2$, Ce-ZrO$_2$, YSZ (yttrium oxide stabilized zirconium oxide), Y$_2$O$_3$, SrTiO$_3$, ZrO$_2$, HfO$_2$, and (BaSr)TiO$_3$ (BST). The mutual diffusion preventive film 4 may be a layer laminated with two or more of materials selected from the group.

First, there are experimentally fabricated an MIS structure (sample A) in which an insulating film according to the invention is provided with a low dielectric constant layer restraining film and a mutual diffusion preventive film and a conventional MIS structure (sample B) having only a mutual diffusion preventive film for comparison.

According to the sample A, a low dielectric constant restraining film of a silicon nitride film of 1 nm through 2 nm is formed previously above a silicon substrate at a main face of the substrate, above which a mutual diffusion preventive layer for preventing mutual diffusion between the silicon substrate and a ferroelectric thin film, mentioned later, is formed by depositing a $CeO_2$ (cerium oxide) film having a film thickness of about 10 nm in an oxygen atmosphere at substrate temperature of 900° C. by using the electron beam vapor deposition process and successively annealing the film in an oxygen atmosphere at 700° C. An Al electrode is formed by a vacuum vapor deposition apparatus in order to measure the capacitance-voltage (C-V) characteristic.

According to sample B, similar to sample A, a mutual diffusion preventive layer for preventing mutual diffusion between the silicon substrate and a ferroelectric thin film, mentioned layer, is formed by depositing a $CeO_2$ film having the film thickness of about 10 nm in an oxygen atmosphere at substrate temperature of 900° C. and successively annealing the film in an oxygen atmosphere at 700° C. An Al electrode is formed by the vacuum paper deposition apparatus in order to measure the capacitance-voltage (C-V) characteristic.

Figure 3:
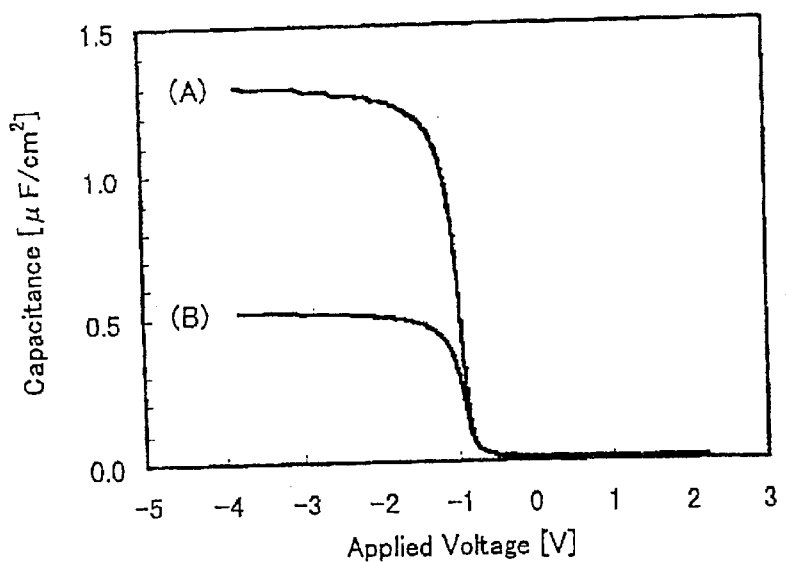
FIG. 3 is a graph showing a capacitance-voltage (C-V) characteristic of a sample (Al/CeO$_2$/SiON/Si) having a composition according to an embodiment of the invention and a sample (Al/CeO$_2$/Si) having a conventional composition.

FIG. 3 shows a graph of a result of capacitance-voltage (C-V) characteristics of sample A (Al/$CeO_2$/SiON/Si) produced by a silicon oxynitride film (SiON) of the low ferroelectric constant layer preventive film, the mutual diffusion preventive film ($CeO_2$) and the aluminum electrode (Al) above the p-type silicon substrate (Si) provided by the above-described process of embodiment and sample B (Al/$CeO_2$/Si) formed with the mutual diffusion preventive film ($CeO_2$) and laminated with the aluminum electrode (Al) above the p-type silicon substrate (Si) according to the conventional example. In FIG. 3, notation (A) designates a graph of the capacitance-voltage characteristic of the sample (Al/$CeO_2$/SiON/Si) according to the invention and notation (B) designates a graph of the capacitance-voltage characteristic of the sample (Al/$CeO_2$/Si) according to the conventional structure. As is apparent from the result, it is known that the sample A is provided with the characteristic in which capacitance thereof is improved in comparison with that of the sample B. This is due to the fact that the low dielectric constant layer between the silicon semiconductor substrate and the mutual diffusion restraining film can be restrained.

Next, there is formed a ferroelectric thin film of $SrBi_2Ta_2O_9$ (SBT) by a film thickness of about 500 nm respectively above the insulating film provided by the above-described process of embodiment having the low dielectric constant layer restraining film and the mutual diffusion preventive film of sample A and the insulating film having only the mutual expansion preventive film of sample B. As a method of forming thereof, there are prepared organic metal solutions of strontium (Sr), bismuth (Bi), tantalum (Ta) comprising 2-ethyl-hexene-hydrochloric acid, the solutions are mixed by rates of Sr:Bi:Ta=0.8:2.2:2 by metal molar ratios and the solution is diluted by hexene to constitute 0.15 molar percent. The solution is dripped to coat a wafer of the substrate 1 rotated at 2000 rpm, dried in the atmosphere at 150° C. and thereafter dried at 250° C. and is dried in an oxygen atmosphere at 400° C. by a tubular furnace. The operation is repeated by again coating the chemical solution on the wafer and the chemical solution is coated onto the wafer and dried by a total of five times. Next, in order to measure the capacitance-voltage (C-V) characteristic, upper electrode platinum (Pt) is deposited on the ferroelectric thin film by about 200 nm by using an RF sputter apparatus. Finally, the sample is crystallized and annealed in an oxygen atmosphere at 700° C. to thereby form the MFIS structure.

Figure 4:
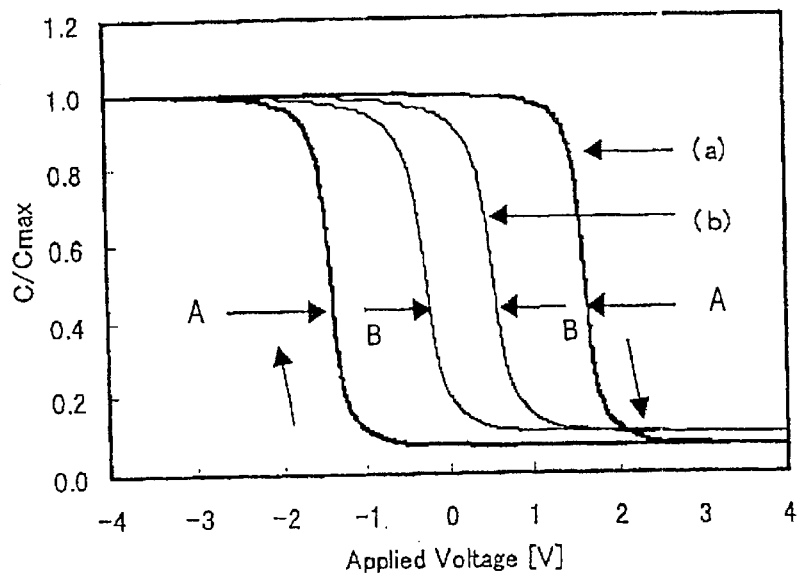
FIG. 4 is a graph showing a capacitance-voltage (C-V) characteristics of a sample (Pt/SBT/CeO$_2$/SiON/Si) having a composition according to an embodiment of the invention and a sample (Pt/SBT/CeO$_2$/Si) having a conventional composition.

FIG. 4 is a graph showing capacitance-voltage (C-V) characteristics of sample A (Pt/SBT/$CeO_2$/SiON/Si) laminated with an SBT ferroelectric thin film on an insulating film having the low dielectric rate layer restraining film (SiON) and the mutual diffusion preventive film ($CeO_2$) having the structure of the invention provided by the above-described process of embodiment and attached with the Pt electrode and sample B (Pt/SBT/$CeO_2$/Si) laminated with the SBT ferroelectric thin film on the insulating film having only the mutual diffusion preventive film ($CeO_2$) according to the conventional example and attached with the Pt electrode. In FIG. 4, C/Cmax of the ordinate signifies a normalized capacitance. The abscissa represents applied voltage (V). As is apparent from FIG. 4, a deviation of a threshold (memory window width) A produced by polarizing the ferroelectric material in curve (a) is provided with a magnitude 3.7 times as large as that of a deviation of a threshold (memory window width) B in curve (b). It is known therefrom that by being able to restrain the low dielectric constant layer between the silicon semiconductor substrate and the mutual diffusion preventive film, the capacitance of the buffer layer is improved and voltage can be applied to the ferroelectric thin film further sufficiently.

Figure 2A:
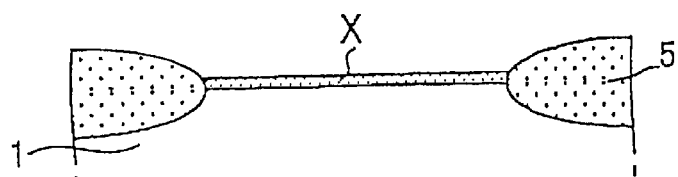
FIG. 2A is a view showing a portion of steps of fabricating a ferroelectric non-volatile memory element according to an embodiment of the invention.
Figure 2B:
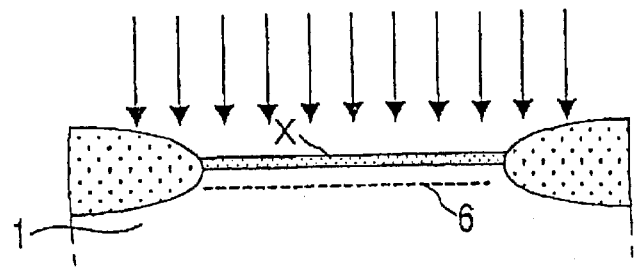
FIG. 2B is a view showing a portion of the fabrication steps of the ferroelectric non-volatile memory element according to an embodiment of the invention.

FIGS. 2A through 2H show a fabricating process of MFIS-FET applied to a ferroelectric memory element according to an embodiment of the invention. In FIG. 2A, to start, the semiconductor single crystal substrate 1 of p-type silicon (100) having a resistivity of 10 Wcm is provided. A field oxide film region 5 for isolating elements and a sacrifice oxide film X having a film thickness of 35 nm are formed above a main face of the substrate 1. In successive FIG. 2B, in order to form a low dielectric constant layer restraining film, nitrogen 6 is implanted from the main face to the substrate 1 via the sacrifice oxide film X by acceleration energy of 15 KeV and a dose amount of $1E15/cm^2$. Further after etching the sacrifice oxide film X, in FIG. 2C, the sample is heated in a diluted oxygen atmosphere at about 850° C. and there is formed the low dielectric constant layer restraining film 3 of a silicon oxynitride film (SiON film) having a film thickness of 1 nm through 2 nm on the main face of the substrate 1.

Next, in FIG. 2D, the mutual diffusion preventive layer 4 for preventing mutual diffusion between the silicon substrate 1 and a ferroelectric thin film, mentioned later, is formed above the low dielectric constant layer restraining film 3. The mutual diffusion preventive layer 4 is formed by depositing a $CeO_2$ (cerium oxide film) having a film thickness of about 10 nm in an oxygen atmosphere at substrate temperature of 900° C. and annealing the film in an oxygen atmosphere at 700° C.

Next there are prepared organic metal solutions of strontium (Sr), bismuth (Bi) and tantalum (Ta) comprising 2-ethyl-hexene-hydrochloric acid, the solutions are mixed by rates of Sr:Bi:Ta=0.8:2.2:2 in metal molar ratios and the organic metal solution is diluted by hexene to constitute 0.15 molar percent. The chemical solution is dripped to coat onto a wafer of the substrate 1 rotated by 2000 rpm, dried in the atmosphere at 150° C., thereafter dried at 250° C. and dried in an oxygen atmosphere at 400° C. by a tubular furnace. The operation is repeated by coating again the chemical solution on the wafer and the chemical solution is coated to the wafer and the dried by a total of five times. As a result, as shown in FIG. 2E, a ferroelectric thin film 6 of $SrBi_2Ta_2O_9$ (SBT) is formed by a film thickness of about 500 nm and is laminated on the mutual diffusion preventive film 4. Next, in FIG. 2F, an upper electrode 7 of platinum (Pt) is deposited on the ferroelectric thin film 6 by a thickness of 200 nm by using an RF sputter apparatus.

A photoresist is then coated on the surface of platinum, exposed and thereafter developed. Further, by RIE (Reactive Ion Etching) with Ar and $SF_6$ gas as etchants, the laminated film of FIG. 2F is etched to thereby fabricate to form a gate portion shown in FIG. 2G. At this occasion, by utilizing the fact that the etching rate is retarded by the $CeO_2$ film 4, etching is stopped by the silicon oxynitride film (SiON film) 3 above the silicon substrate 1.

Figure 2C:
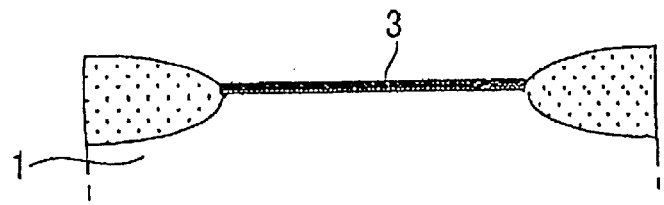
FIG. 2C is a view showing a portion of the fabrication steps of the ferroelectric non-volatile memory element according to an embodiment of the invention.
Figure 2D:
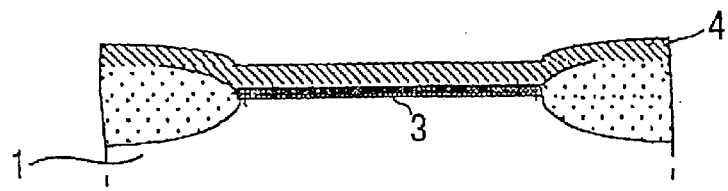
FIG. 2D is a view showing a portion of the fabrication steps of the ferroelectric non-volatile memory element according to an embodiment of the invention.
Figure 2:
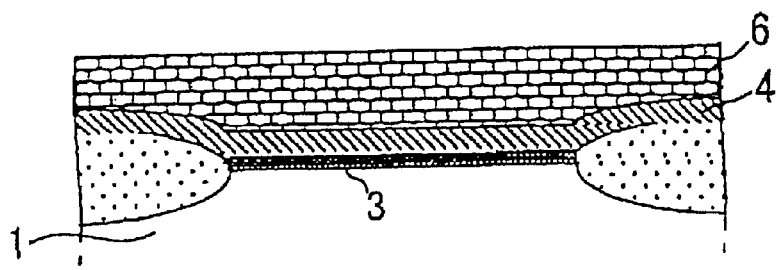
FIG. 2E is a view showing a portion of the fabrication steps of the ferroelectric non-volatile memory element according to an embodiment of the invention.
FIG. 2F is a view showing a portion of the fabrication steps of the ferroelectric non-volatile memory element according to an embodiment of the invention.
FIG. 2G is a view showing a portion of the fabrication steps of the ferroelectric non-volatile memory element according to an embodiment of the invention.
FIG. 2H is a view showing a portion of the fabrication steps of the ferroelectric non-volatile memory element according to an embodiment of the invention.
FIG. 2I is a view showing a portion of the fabrication steps of the ferroelectric non-volatile memory element according to an embodiment of the invention.
Figure 2:
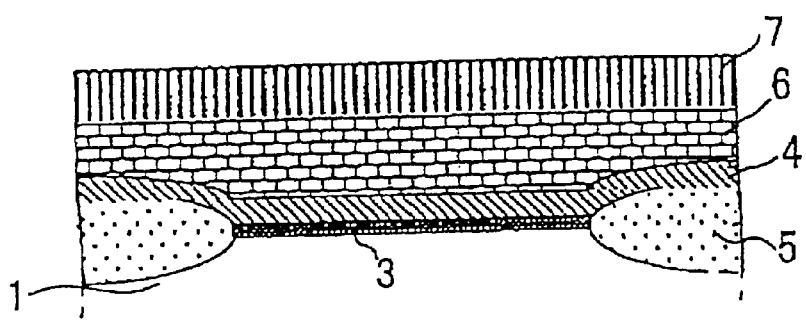
Figure 2:
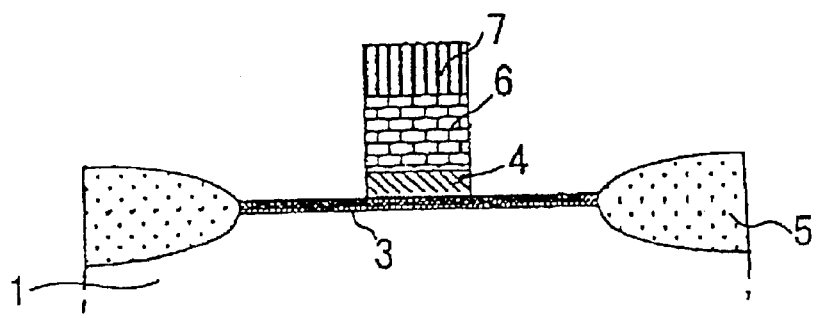
Figure 2H:
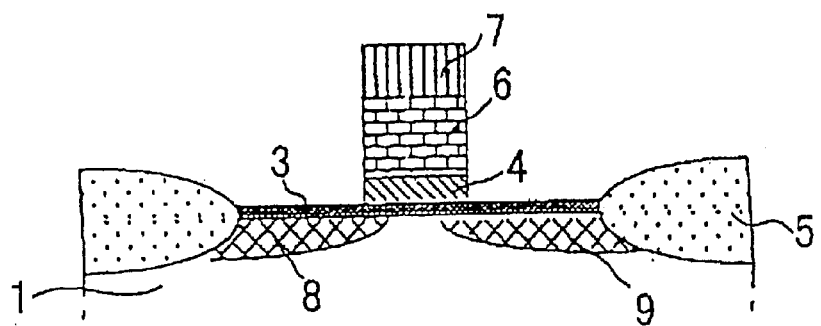
Figure 2:
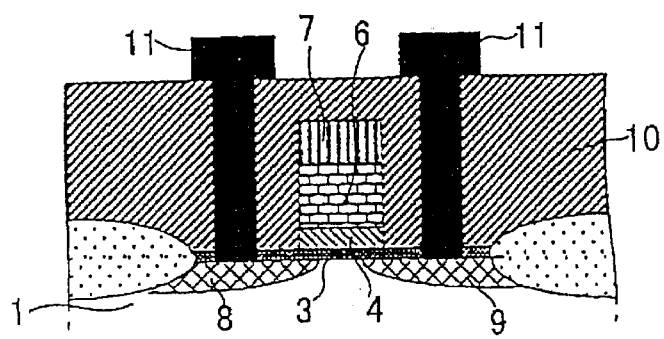

Next, in FIG. 2H, phosphor impurity is implanted into the substrate 1 with the gate portion and field oxide film region 5 as masks by using an ion implantation apparatus, the sample is activated by a tubular furnace and a source region 8 and a drain region 9 are formed in the semiconductor substrate 1. The activating process at this occasion also serves to anneal to recover the ferroelectric thin film 6 produced by etching. Activating and recovering and annealing conditions are constituted by 60 minutes in an oxygen atmosphere at 700° C.

Thereafter, as shown in FIG. 2I, there is formed a BPSG (boron phosphorus silicate glass) film 10 by a $O_3$-TEOS (tetraethylorthosilicate) apparatus as an interlayer film and contact holes are formed by using an RIE apparatus. Next, by using a sputtering process, an aluminum thin film is formed and thereafter, wiring is carried out by a lithography step and the aluminum electrodes 11 are formed.

When ON and OFF of current between the source and the drain is controlled by using spontaneous polarization of SBT, the phenomenon can be confirmed and it can be confirmed that the element can be operated as an nonvolatile memory.

The above-described embodiment can be modified as follows. First, the low dielectric constant layer restraining 3 may be a silicon nitride film. The mutual diffusion preventive film 4 can similarly be formed as a layer of one material selected from the group consisting of $CeZrO_2$, YSZ (yttrium oxide stabilized zirconium oxide), $Y_2O_3$, $SrTiO_3$, $ZrO_2$, $HfO_2$, and $(BaSr)TiO_3$ (BST). Further, layers of a plurality of materials may be laminated. The ferroelectric thin film 6 can similarly be formed by a thin film of one material selected from the group consisting of $PbTiO_3$, $PbZr_xTi_{1-x}O_3$, $Pb_yLa_{1-x}Zr_xTi_{1-x}O_3$, $Bi_4Ti_3O_{12}$, $SrNbO_7$, $Sr_2(Ta_xNb_{1-x})_2O_7$ and $SrBi_2Ta_2O_9$. The process of forming the ferroelectric thin film 6 of FIG. 2E, can similarly be carried out by vacuum vapor deposition, laser abrasion process, MOCVD or sputtering.

Further, the mutual diffusion preventive film can similarly be formed after etching the sacrifice oxide film without forming the low dielectric constant layer restraining film described in the above-mentioned embodiment of FIG. 2C.

As has been explained, in a ferroelectric non-volatile memory element according to the invention, by providing the low dielectric constant layer restraining film and the mutual diffusion preventive film as the insulating film between the silicon semiconductor substrate and the ferroelectric film, voltage can be applied sufficiently to the ferroelectric thin film by restraining unnecessary low dielectric constant layer from being formed on the silicon semiconductor substrate. As a result, the ferroelectric memory element is provided with a high reliability and large reading margin.

What is claimed is:

1. A ferroelectric memory element, comprising:
   a silicon semiconductor substrate;
   an insulating film arranged above said substrate; and
   a ferroelectric film arranged above said insulating film,
   said insulating film including a low dielectric constant layer restraining film and a mutual diffusion preventive film, said low dielectric constant layer restraining film being thinner than said ferroelectric film,
   said low dielectric constant layer restraining film being a silicon oxynitride film or a silicon nitride film,
   said mutual diffusion preventive film being a cerium oxide ($CeO_2$) film, and
   said ferroelectric film being a film of $SrBi_2Ta_2O_9$.

2. The ferroelectric memory element according to claim 1, wherein said low dielectric constant layer restraining film is a silicon nitride film.

3. The ferroelectric memory element according to claim 1, wherein said low dielectric constant layer restraining film has a thickness of 1 nm to 2 nm.

4. The ferroelectric memory element according to claim 3, wherein said mutual diffusion preventive film has a thickness of about 10 nm.

5. The ferroelectric memory element according to claim 1, wherein said low dielectric constant layer restraining film is a silicon oxynitride film.

6. A ferroelectric memory element, comprising:
   a silicon semiconductor substrate;
   an insulating film laminated onto said substrate; and
   a ferroelectric film laminated onto said insulating film,
   said insulating film including a low dielectric constant layer restraining film in contact with said substrate and a mutual diffusion preventive film, said low dielectric constant layer restraining film having a thickness of 1 nm to 2 nm,
   said low dielectric constant layer restraining film being an insulating film mainly comprising a silicon nitride film.

7. The ferroelectric memory element according to claim 6, wherein said mutual diffusion preventive film has a thickness of about 10 nm.

8. A ferroelectric memory element, comprising:
   a silicon semiconductor substrate;
   an insulating film laminated onto said substrate; and
   a ferroelectric film laminated onto said insulating film,
   said insulating film including a low dielectric constant layer restraining film in contact with said substrate and a mutual diffusion preventive film,
   said low dielectric constant layer restraining film having a thickness of 1 nm to 2 nm,
   said low dielectric constant layer restraining film being a silicon oxynitride film,
   said mutual diffusion preventive film being a cerium oxide ($CeO_2$) film and
   said ferroelectric film being a film of $SrBi_2Ta_2O_9$.

9. A ferroelectric memory element, comprising:
   a silicon semiconductor substrate;
   an insulating film laminated onto said substrate; and
   a ferroelectric film laminated onto said insulating film,
   said insulating film including a low dielectric constant layer restraining film in contact with said substrate and a mutual diffusion preventive film,
   said low dielectric constant layer restraining film having a thickness of 1 nm to 2 nm,
   said low dielectric constant layer restraining film being a silicon nitride film,
   said mutual diffusion preventive film being a cerium oxide ($CeO_2$) film and
   said ferroelectric film being a film of $SrBi_2Ta_2O_9$.

* * * * *